(12) United States Patent
Ito et al.

(10) Patent No.: US 11,737,341 B2
(45) Date of Patent: Aug. 22, 2023

(54) DETECTION DEVICE AND DISPLAY DEVICE

(71) Applicant: Japan Display Inc., Tokyo (JP)

(72) Inventors: Tomoyuki Ito, Tokyo (JP); Jin Hirosawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/654,266

(22) Filed: Mar. 10, 2022

(65) Prior Publication Data
US 2022/0302227 A1 Sep. 22, 2022

(30) Foreign Application Priority Data
Mar. 16, 2021 (JP) ................. 2021-042470

(51) Int. Cl.
| | |
|---|---|
| *G09G 5/00* | (2006.01) |
| *H10K 59/65* | (2023.01) |
| *G06V 10/147* | (2022.01) |
| *G02B 27/30* | (2006.01) |
| *G06V 40/13* | (2022.01) |

(52) U.S. Cl.
CPC ............ *H10K 59/65* (2023.02); *G02B 27/30* (2013.01); *G06V 10/147* (2022.01); *G06V 40/1318* (2022.01)

(58) Field of Classification Search
CPC ............ H01L 27/3234; G06V 10/147; G06V 40/1318; G02B 27/30; H10K 59/65
USPC ......................................... 345/156
See application file for complete search history.

(56) References Cited

U.S. PATENT DOCUMENTS

| | | | |
|---|---|---|---|
| 2003/0174870 A1 | 9/2003 | Kim et al. | |
| 2010/0148294 A1* | 6/2010 | Fujii | H04N 5/2253 257/435 |
| 2018/0165497 A1 | 6/2018 | Lee et al. | |
| 2019/0214418 A1* | 7/2019 | Sasaki | H01L 27/14627 |
| 2020/0381470 A1* | 12/2020 | Ho | H01L 27/14629 |
| 2021/0124895 A1* | 4/2021 | Xiong | G06V 40/1318 |
| 2021/0225948 A1* | 7/2021 | Liu | H01L 51/5275 |
| 2022/0050987 A1* | 2/2022 | Chiu | H01L 27/14678 |

FOREIGN PATENT DOCUMENTS

| | | |
|---|---|---|
| JP | 3840595 B2 | 11/2006 |
| JP | 6479151 B2 | 3/2019 |

* cited by examiner

*Primary Examiner* — Jennifer T Nguyen
(74) *Attorney, Agent, or Firm* — Maier & Maier, PLLC

(57) ABSTRACT

According to one embodiment, a detection device comprises a base, a sensor layer, a collimator, a plurality of lenses, and a spacer. The sensor layer is placed on the base and includes a plurality of sensors which output detection signals corresponding to incident light. The collimator layer is placed on the sensor layer and includes a collimator having a plurality of openings which overlap the sensors, respectively. The plurality of lenses are placed on the collimator layer and overlap the openings, respectively. The spacer protrudes more than the lenses in a stacking direction of the base, the sensor layer and the collimator layer.

8 Claims, 8 Drawing Sheets

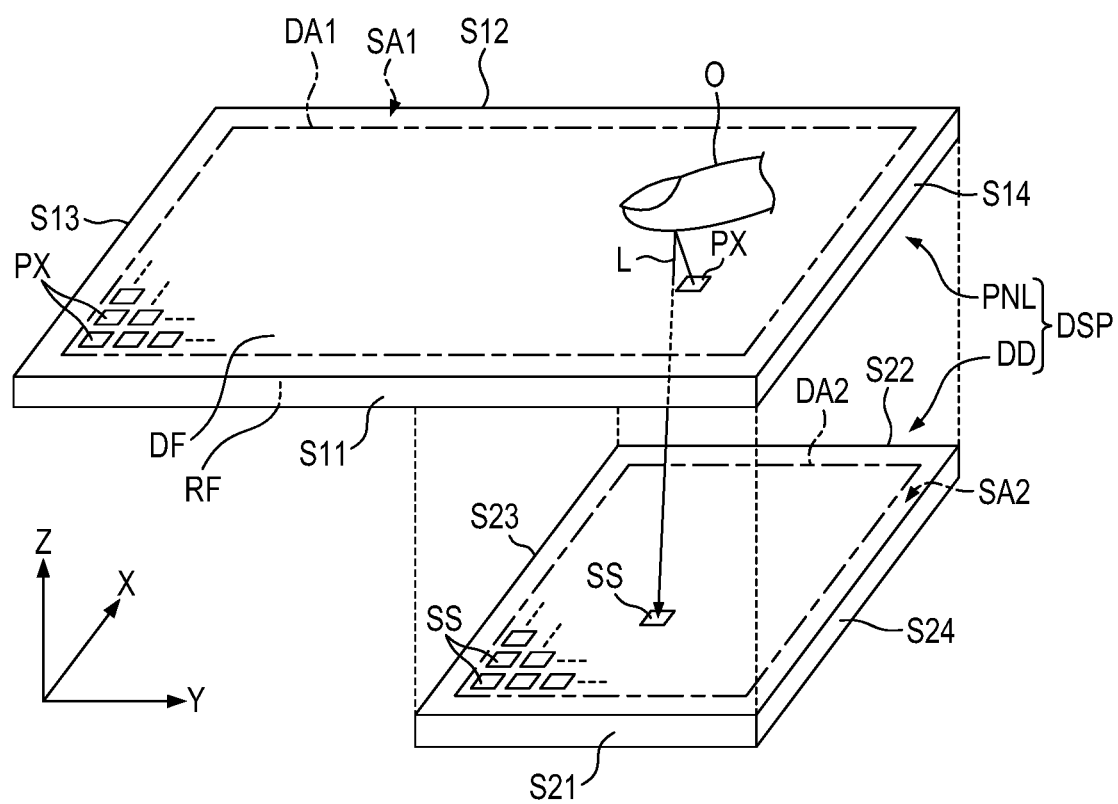
F I G. 1

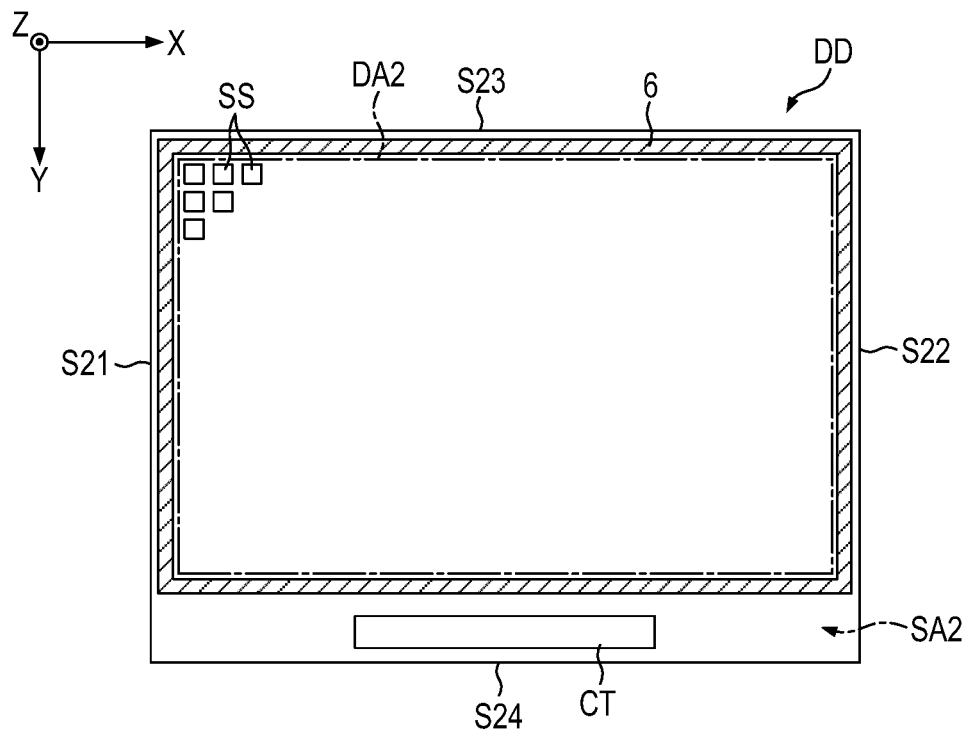
F I G. 4
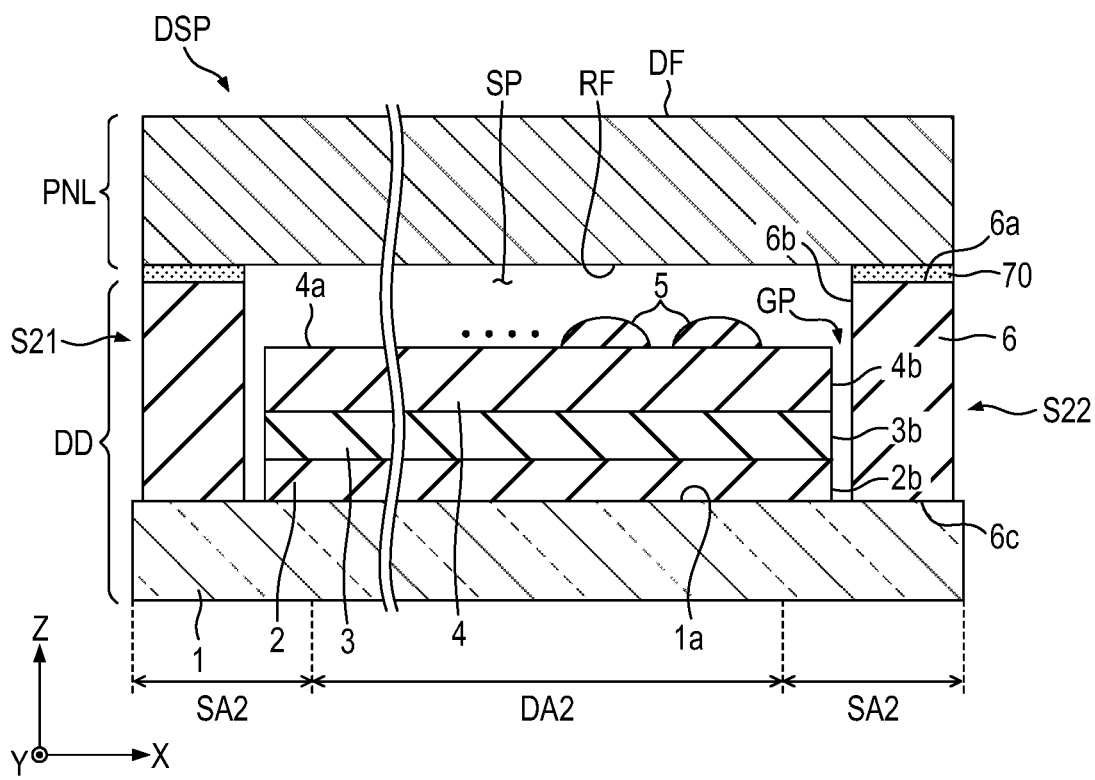
F I G. 5

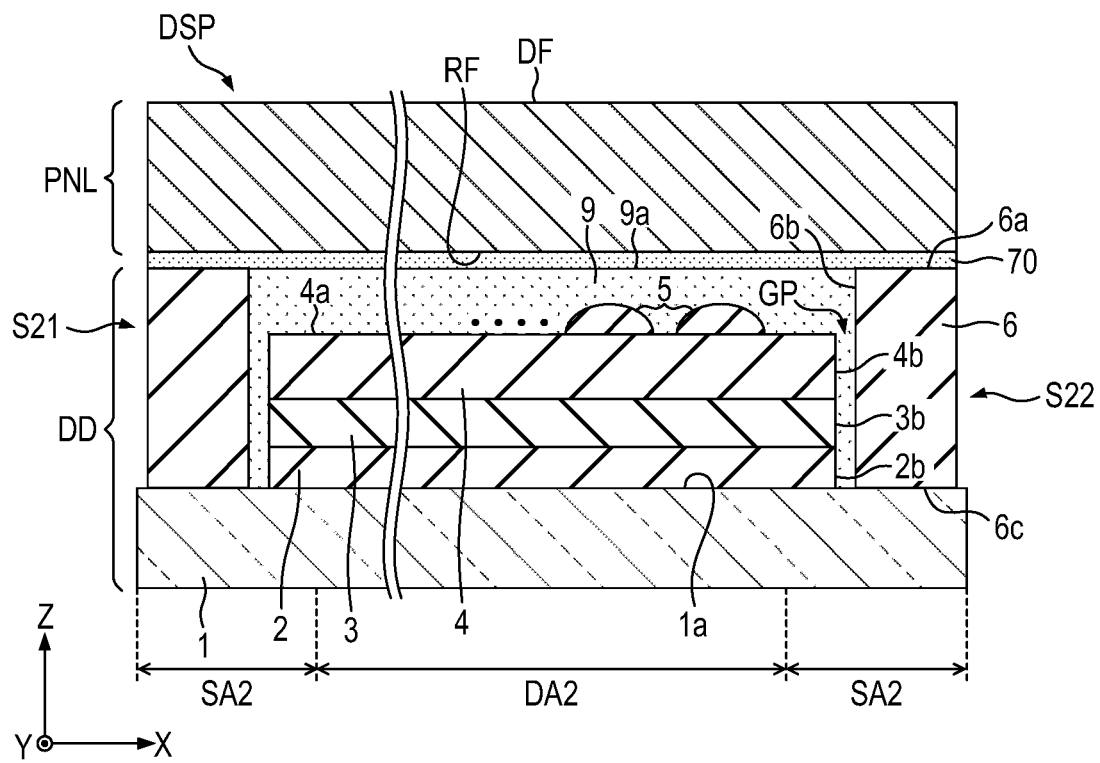
F I G. 12
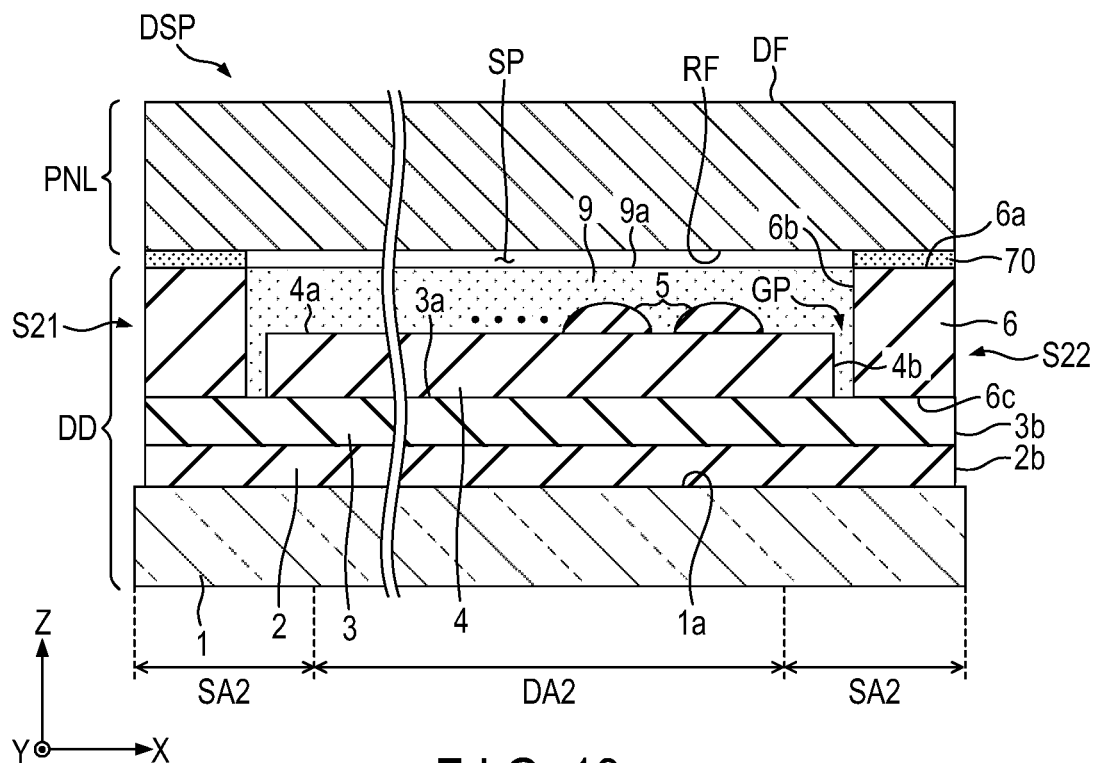
F I G. 13

DETECTION DEVICE AND DISPLAY DEVICE

CROSS-REFERENCE TO RELATED APPLICATION

This application is based upon and claims the benefit of priority from Japanese Patent Application No. 2021-042470, filed Mar. 16, 2021, the entire contents of which are incorporated herein by reference.

FIELD

Embodiments described herein relate generally to a detection device and a display device.

BACKGROUND

A display device including a display panel that displays an image and a detection device including a sensor that detects biological information such as a fingerprint is known. As the sensor, for example, an optical sensor using a photoelectric conversion element is used.

The detection device is attached to the display panel with a space therebetween. Separate parts are required for the attachment. The parts may increase the display device in size. There are other various improvements in a structure for attaching the detection device to the display panel.

BRIEF DESCRIPTION OF THE DRAWINGS

FIG. 1 is a schematic exploded perspective view of a display device according to a first embodiment.

FIG. 4 is a schematic plan view of the detection device according to the first embodiment.

FIG. 5 is a schematic sectional view of the display device according to the first embodiment.

FIG. 12 is a schematic sectional view of a display device according to a first modification.

FIG. 13 is a schematic sectional view of a display device according to a second modification.

DETAILED DESCRIPTION

Figure 2:
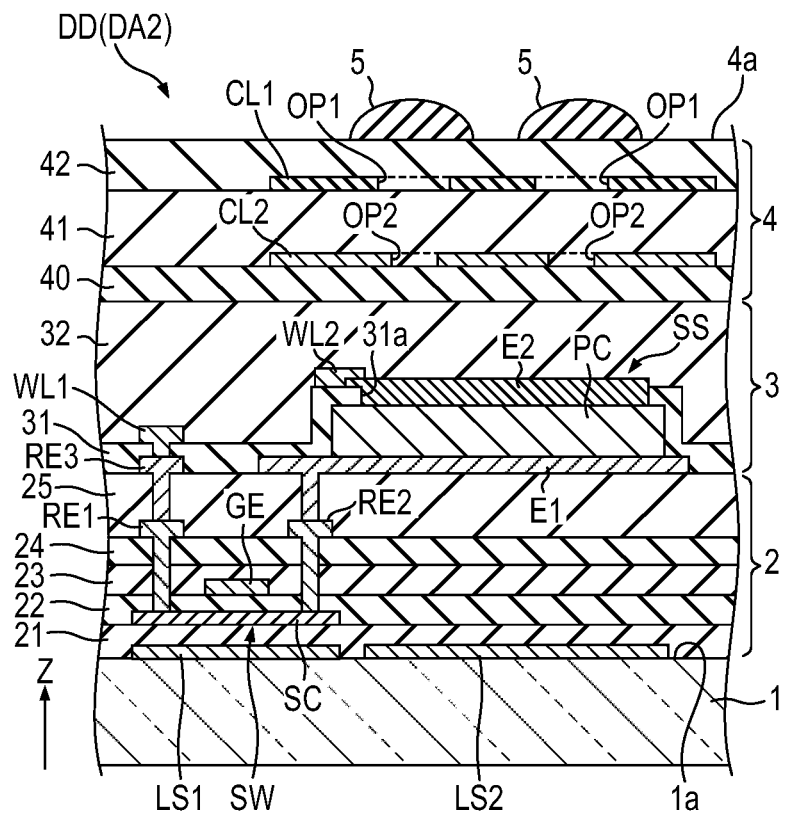
FIG. 2 is a schematic sectional view of a detection device according to the first embodiment.

In general, according to one embodiment, a detection device comprises a base, a sensor layer, a collimator, a plurality of lenses, and a spacer. The sensor layer is placed on the base and includes a plurality of sensors which output detection signals corresponding to incident light. The collimator layer is placed on the sensor layer and includes a collimator having a plurality of openings which overlap the sensors, respectively. The plurality of lenses are placed on the collimator layer and overlap the openings, respectively. The spacer protrudes more than the lenses in a stacking direction of the base, the sensor layer and the collimator layer.

According to an embodiment, a display device comprises the detection device, a display panel overlapping the detection device, and an adhesive layer by which the display panel is boned to a spacer.

According to such structures, the detection device that can be easily attached to the display panel and the display device including the detection device.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

In each of the embodiments, a display device including an organic electroluminescent (EL) display element is disclosed as one example. However, none of the embodiments prevents the technical ideas disclosed in the embodiments from being applied to a display device including other types of display element. The other types of display element include, for example, a liquid crystal display element and an LED display element. In addition, the detection device disclosed in each of the embodiments can be applied to a variety types of electronic device having no display function.

First Embodiment

FIG. 1 is a schematic exploded perspective view of a display device DSP according to a first embodiment. In the first embodiment, a first direction X, a second direction Y and a third direction Z are defined as shown in FIG. 1. As one example, the first direction X, second direction Y and third direction Z are orthogonal to each other, but these directions may intersect at an angle other than 90 degrees. The first direction X and second direction Y correspond to the direction parallel to the main surface of each of the substrates included in the display device DSP, and the third direction Z corresponds to the thickness direction of the display device DSP and the stacking direction of layers included in the display device DSP. In the present specification, the direction of the arrow indicating the third direction Z may be referred to as "up" and its opposite direction may be referred to as "down". Viewing the display device DSP and its components in parallel with the third direction Z will be referred to as a planar view.

The display device DSP includes a display panel PNL and a detection device DD. The display panel PNL and detection device DD are stacked one on another in the third direction Z. Though the display panel PNL and detection device DD are spaced from each other as shown in FIG. 1, they are bonded to each other as will be described later.

The display panel PNL is shaped like a rectangle having a first side S11 along the second direction Y, a second side S12 along the second direction Y, a third side S13 along the first direction X and a fourth side S14 along the first direction X. In the example of FIG. 1, the first and second sides S11 and S12 are long, and the third and fourth sides S13 and S14 are short. The shape of the display panel PNL is not limited to the rectangle, but may be other shapes such as a square and a circle.

The display panel PNL includes a display area DA1 in which a plurality of pixels PX are arranged in a matrix and a surrounding area SA1 around the display area DA1. The pixels PX include, for example, a red sub-pixel, a green sub-pixel and a blue sub-pixel. Each of the sub-pixels includes an organic EL display element. The pixels PX may include sub-pixels of other colors, such as white.

The display panel PNL has a display surface DF on which an image is displayed and a rear surface RF that is the opposite side of the display surface DF. Both the display surface DF and rear surface RF are planes that are parallel to the first direction X and second direction Y.

The detection device DD is shaped like a rectangle having a first side S21 along the second direction Y, a second side S22 along the second direction Y, a third side S23 along the first direction X and a fourth side S24 along the first direction X. In the example of FIG. 1, the first and second sides S21 and S22 are short and the third and fourth sides S23 and S24 are long. The detection device DD is not limited to the shape shown in FIG. 1, but may be shaped like a rectangle whose first and second sides S21 and S22 are long and whose third and fourth sides S23 and S24 are short. The shape of the detection device DD may be other shapes such as a square and a circle.

The detection device DD includes a detection area DA2 and a surrounding area SA2 around the detection area DA2. In the detection area DA2, a plurality of sensors SS are arranged in a matrix. The sensors SS are optical sensors that sense light.

The detection device DD is attached onto the rear surface RF. In the example of FIG. 1, the detection device DD is smaller than the display panel PNL. Specifically, the first side S21 and the second side S22 of the detection device DD are shorter than the first side S11 and the second side S12 of the display panel PNL. The third side S23 and the fourth side S24 of the detection device DD are, for example, the same as the third side S13 and the fourth side S14 of the display panel PNL. However, the third side S23 and the fourth side S24 may be shorter than the third side S13 and the fourth side S14.

The detection device DD overlaps a portion of the display panel PNL, which is closer to the fourth side S14, in the third direction Z. That is, the detection area DA2 overlaps a portion of the display area DA1, which is closer to the fourth side S14. Note that the overlap of the detection device DD and the display panel PNL (the overlap of the detection area DA2 and the display area DA1) is not limited to the example shown in FIG. 1. The detection device DD may have the same size as the display panel PNL and, in this case, the detection area DA2 is entirely put on the display area DA1.

When a sensor SS performs sensing, a pixel PX emits light L for illumination. The light L is reflected by an object O, such as a user's finger, which is in contact with or close to the display surface DF, and is transmitted through the display panel PNL to enter the sensor SS. The sensor SS outputs a sensing signal corresponding to the incident light. Accordingly, the detection device DD can detect the object O that is in contact with or close to the display surface DF. If, furthermore, sensing signals of a plurality of sensors SS are used, irregularities (e.g., fingerprints) on the surface of the object O can be detected.

The sensors SS can also be used to detect information on a living body based on light reflected inside the object O in addition to or instead of detecting a fingerprint. The information on a living body is, for example, blood vessel images of a vein and the like, a pulse and a pulse wave.

FIG. 2 is a schematic sectional view showing an example of a structure that is applicable to the detection area DA2 of the detection device DD. The structure shown in FIG. 2 corresponds to a single sensor SS. The detection device DD includes a base 1, a circuit layer 2, a sensor layer 3, a collimator layer 4 and a lens 5. The base 1, circuit layer 2, sensor layer 3, collimator layer 4 and lens 5 are stacked in the order presented in the third direction Z (stacking direction). As the base 1, for example, a glass substrate and a resin substrate can be used.

The circuit layer 2 includes insulating layers 21, 22, 23, 24 and 25 stacked in order in the third direction Z. The sensor layer 3 includes insulating layers 31 and 32 stacked in order in the third direction Z. The collimator layer 4 includes transparent layers 41 and 42 stacked in order in the third direction Z. The transparent layers 41 and 42 may also be referred to as insulating layers.

The insulating layers 21, 22, 23, 24 and 31 are each formed of, for example, an inorganic material. The insulating layers 25 and 32 are each formed of, for example, an organic material and serve as planarizing films. The thickness of each of the insulating layers 25 and 32 is greater than that of each of the insulating layers 21, 22, 23, 24 and 31. The transparent layers 41 and 42 are each formed of an organic material. In the example of FIG. 2, the thickness of the transparent layer 41 is greater than that of the transparent layer 42. At least one of the transparent layers 41 and 42 may be formed of an inorganic material or may be a stacked layer body of a layer formed of an organic material and a layer formed of an inorganic material.

In the example of FIG. 2, the collimator layer 4 further includes a cut layer 40 that blocks light in a specific wavelength region. The specific wavelength region is, for example, 650 nm or more and 800 nm or less, and may further include a band of 800 nm or more. That is, the cut layer 40 blocks at least part of the light in a wavelength region of 650 nm or more. The cut layer 40 is formed of, for example, a material having a lower transmittance of light in the specific wavelength region (a material having a higher absorbance or reflectance of light in the specific wavelength region). The cut layer 40 may be a band pass filter using a dielectric multilayer film including a plurality of dielectrics having different refractive indices and, in this case, the cut layer 40 is improved in its transmittance of visible light. In the example of FIG. 2, the cut layer 40 is located between the insulating layer 32 and the transparent layer 41. However, the location of the cut layer 40 is not limited to this example.

The circuit layer 2 includes light-shielding layers LS1 and LS2, a switching element SW (thin-film transistor) and relay electrodes RE1 and RE2. The light-shielding layers LS1 and LS2 are placed on the top surface 1a of the base 1 and covered with the insulating layer 21. The light-shielding layers LS1 and LS2 are each formed of, for example, a metallic material and have light-shielding properties.

The switching element SW includes a semiconductor layer SC and a gate electrode GE. The semiconductor layer SC is interposed between the insulating layers 21 and 22 and opposed to the light-shielding layer LS1. The gate electrode GE is interposed between the insulating layers 22 and 23 and opposed to the semiconductor layer SC. The relay electrodes RE1 and RE2 are each interposed between the insulating layers 24 and 25 and are in contact with the semiconductor layer SC through contact holes penetrating the insulating layers 22, 23 and 24.

The sensor layer 3 includes a sensor SS, lines WL1 and WL2 and a relay electrode RE3. The sensor SS includes a first electrode E1 (lower electrode), a second electrode E2 (upper electrode) and a photoelectric conversion element PC.

The relay electrode RE3 is interposed between the insulating layers 25 and 31 and is in contact with the relay electrode RE1 through a contact hole penetrating the insulating layer 25. The line WL1 is formed between the insulating layers 31 and 32 and is in contact with the relay electrode RE3 through a contact hole penetrating the insulating layer 31.

The first electrode E1 is interposed between the insulating layers 25 and 31 and is in contact with the relay electrode RE2 through a contact hole penetrating the insulating layer 25. The photoelectric conversion element PC is placed on the first electrode E1. The bottom surface of the photoelectric conversion element PC is in contact with the first electrode E1. The photoelectric conversion element PC is opposed to the light-shielding layer LS2.

The insulating layer 31 has an opening 31a through which at least part of the top surface of the photoelectric conversion element PC is exposed. The second electrode E2 is interposed between the photoelectric conversion element PC and the insulating layer 32. The second electrode E2 is in contact with the top surface of the photoelectric conversion element PC through the opening 31a. Part of the second electrode E2 is located on the insulating layer 31. The line WL2 is located between the insulating layers 31 and 32 and is in contact with the second electrode E2.

For example, the relay electrodes RE1, RE2 and RE3, lines WL1 and WL2 and first electrode E1 are each formed of a metallic material. The second electrode E2 is formed of a transparent conductive material such as indium tin oxide (ITO). The first electrode E1 formed of a metallic material also functions as a light-shielding layer to suppress incident of light onto the photoelectric conversion element PC from below.

The photoelectric conversion element PC is, for example, a photodiode to output an electrical signal (detection signal) corresponding to incident light. More specifically, a positive intrinsic negative (PIN) photodiode can be used as the photoelectric conversion element PC. This type of photodiode includes a p-type semiconductor layer, an i-type semiconductor layer and an n-type semiconductor layer. The p-type semiconductor layer is located closer to the second electrode E2, the n-type semiconductor layer is located closer to the first electrode E1, and the i-type semiconductor layer is located between the p-type and n-type semiconductor layers. The p-type semiconductor layer, i-type semiconductor layer and n-type semiconductor layer are formed of, for example, amorphous silicon (a-Si), but none of them is limited to the amorphous silicon.

For example, a constant voltage is applied to the line WL2. The gate electrode GE is supplied with a scanning signal with timing when sensing should be performed by the sensor SS. When the gate electrode GE is supplied with a scanning signal, a sensing signal is generated by the photoelectric conversion element PC and output to the line WL1 through the first electrode E1, relay electrode R2, semiconductor layer SC and relay electrodes R1 and R3.

The collimator layer 4 further includes collimators CL1 and CL2. The collimator CL1 is disposed between the transparent layers 41 and 42. The collimator CL2 is disposed between the cut layer 40 and the transparent layer 41. For example, the collimator CL1 is formed of black resin and the collimator CL2 is formed of a metallic material.

The collimators CL1 and CL2 are both opposed to the sensor SS. The collimator CL1 has a plurality of openings OP1. The collimator CL2 has the same number of openings OP2 as the openings OP1. The width (diameter) of each of the openings OP2 is smaller than that of each of the openings OP1. The openings OP1 and OP2 overlap the cut layer 40 in the third direction Z.

The lens 5 is placed on the top surface 4a of the collimator layer 4 (the top surface of the transparent layer 42) at a position corresponding to each of the openings OP1. The lens 5 is, for example, a hemispherical convex in the third direction Z and is formed of a transparent material whose refractive index is higher than that of the transparent layers 41 and 42. As an example, the height of the lens 5 is 2 μm to 12 μm.

The lens 5 condenses the light reflected by the object O described above. The condensed light passes through the openings OP1 and OP2 and enters the photoelectric conversion element PC. The collimators CL1 and CL2 collimate light incident on the sensor SS. That is, the collimators CL1 and CL2 block the light inclined toward the third direction Z. This enhances the sensing accuracy of the sensor SS.

Note that the collimator layer 4 may include only one of the collimators CL1 and CL2. The collimator layer 4 may include three or more collimators that overlap in the third direction Z.

Figure 3:
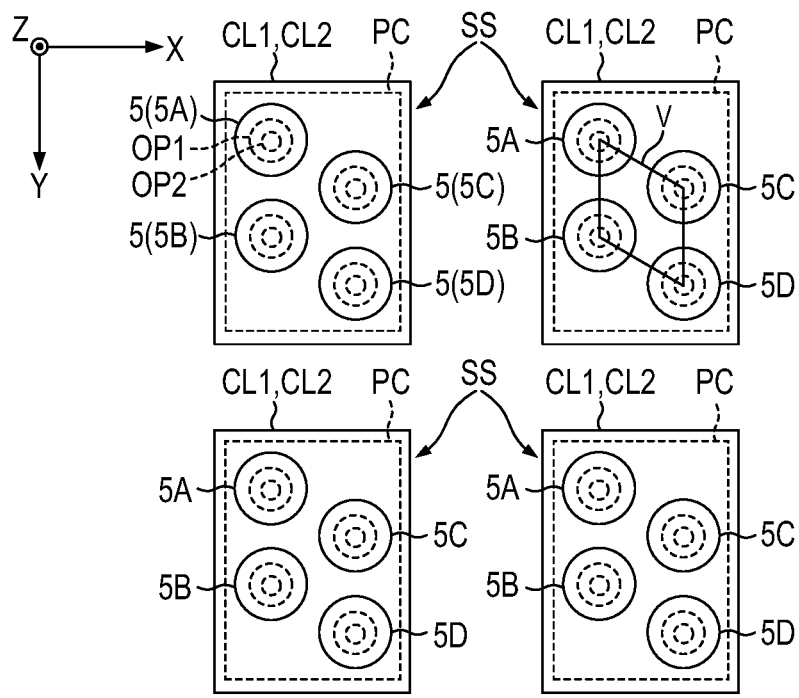
FIG. 3 is a schematic plan view of sensors, collimators and lenses according to the first embodiment.

FIG. 3 is a schematic plan view of sensors SS, collimators CL1 and CL2 and lenses 5. In the example of FIG. 3, four sensors SS are shown. In this example, the photoelectric conversion element PC and the collimators CL1 and CL2 of each of the sensors SS are rectangular, but the shapes of the photoelectric conversion element PC and collimators CL1 and CL2 are not limited to the example. The collimators CL1 and CL2 need not be formed in an island shape for each of the sensors SS, and may have a size overlapping with the sensors SS.

In the example of FIG. 3, four lenses 5 (5A, 5B, 5C, 5D) are arranged for one sensor SS. In addition, openings OP1 and OP2 are formed at positions overlapping each of the lenses 5. The openings OP1 and OP2 are preferably circular as shown. The diameter of each of the lenses 5 is larger than that of each of the openings OP1 and OP2. As one example, the diameter of each of the lenses 5 is 8 μm to 50 μm.

The lenses 5A and 5B are arranged in the second direction Y. The lenses 5C and 5D are also arranged in the second direction Y. The centers of the lenses 5A, 5B, 5C and 5D do not overlap in the first direction X. For example, the centers of the lenses 5A, 5B, 5C and 5D are located to correspond to the vertices of a parallelogram V (rhombus) superposed on, for example, the upper right sensor SS in FIG. 3.

The arrangement of the lenses 5 and openings OP1 and OP2 for one sensor SS is not limited to the example shown in FIG. 3. In addition, neither the number of lenses 5 for one sensor SS nor the number of openings OP1 and OP2 therefor is limited to four, and the number may be three or less or may be five or more.

FIG. 4 is a schematic plan view of the detection device DD. The detection device DD includes a spacer 6. The spacer 6 is placed in the surrounding area SA2. In the first embodiment, the spacer 6 has a frame shape surrounding the detection area DA2. That is, the spacer 6 surrounds the lenses 5 arranged in the detection area DA2.

In the example of FIG. 4, a controller CT is mounted between the detection area DA2 and the fourth side S24. The controller CT is, for example, an IC. The controller CT executes, for example, an arithmetic operating process to detect a fingerprint in response to a sensing signal output from each of the sensors SS to the line WL1. Note that the controller CT may be mounted on, for example, a printed circuit board that connects the detection device DD and an external circuit.

FIG. 5 is a schematic sectional view of the display device DSP along the X-Z plane defined by the first direction X and the third direction Z. In FIG. 5, a detailed structure of the display panel PNL is not shown, but the display panel PNL may include a transparent base, a drive circuit formed for each pixel PX, an organic EL display element connected to the drive circuit, a sealing layer covering the organic EL display element, a polarizer, and a cover member such as a glass substrate constituting the uppermost surface.

The spacer 6 has a top surface 6a, a side surface 6b (inner peripheral surface) and a bottom surface 6c. In the first embodiment, the bottom surface 6c is in contact with the top surface 1a of the base 1.

The circuit layer 2 has a side surface 2b opposed to the spacer 6. The sensor layer 3 has a side face 3b opposed to the spacer 6. The collimator layer 4 has a side surface 4b opposed to the spacer 6. In the first embodiment, a gap GP is provided between each of the side surfaces 2b, 3b and 4b and the side surface 6b. The gap GP is located in the surrounding area SA2, and in planar view, is shaped like a ring surrounding the detection area DA2.

The spacer 6 protrudes in the third direction Z more than the lenses 5 arranged in the detection area DA2. That is, the distance between the top and bottom surfaces 6a and 6c of the spacer 6 (the height of the spacer 6) is greater than the distance between the apex of each of the lenses 5 and the top surface 1a of the base 1 in the third direction Z. The spacer 6 is formed of, for example, an organic material and has insulation properties.

The display panel PNL and the detection device DD are bonded by an adhesive layer 70. In the first embodiment, the adhesive layer 70 is formed between the top surface 6a of the spacer 6 and the rear surface RF of the display panel PNL. Similarly to the spacer 6, the adhesive layer 70 is shaped like a frame in planar view and is located in the surrounding area SA2. The adhesive layer 70 does not overlap the detection area DA2 in planar view. That is, the adhesive layer 70 is not opposed to each of the lenses 5.

By bonding the display panel PNL and the detection device DD as described above, a space SP is formed between the display panel PNL and the detection device DD. The space SP is, for example, an airspace. Since the spacer 6 protrudes in the third direction Z more than the lenses 5, the lenses 5 and the display panel PNL do not come into contact with each other.

Although FIG. 5 shows the sectional structure of the detection device DD and the display device DSP in the vicinity of the first and second sides S21 and S22, a similar structure can be applied in the vicinity of the third and fourth sides S23 and S24.

In the first embodiment described above, the detection device DD includes the spacer 6 protruding in the third direction Z more than the lenses 5. With this configuration, the detection device DD can be attached to the display panel PNL by bonding the top surface 6a of the spacer 6 and the rear surface RF of the display panel PNL via the adhesive layer 70. This attachment method requires no special parts. Therefore, the detection device DD can easily be attached to the display panel PNL, and the display device DSP can be miniaturized.

The spacer 6 causes a space SP to be formed between the display panel PNL and the detection device DD, and the lenses 5 are located in the space SP. Since the lenses 5 do not come into contact with the display panel PNL, their optical function is not inhibited from being performed, with the result that the sensors SS can be increased in their sensing accuracy.

If the spacer 6 is shaped like a frame surrounding the detection area DA2 as shown in FIG. 4, the entire periphery of the detection area DA2 can be bonded to the display panel PNL satisfactorily. Furthermore, a uniform space SP can be formed all over the detection area DA2.

If the adhesive layer 70 is shaped like a frame surrounding the detection area DA2 and is not opposed to the lenses 5, its optical properties such as a refractive index do not affect the sensing of the sensors SS. Thus, the range of options to choose a material for the adhesive layer 70 is widened.

If the gap GP is provided as shown in FIG. 5, moisture can be prevented from entering the circuit layer 2, sensor layer 3 and collimator layer 4 through the spacer 6. Accordingly, the detection device DD and the display device DSP can be increased in their reliability.

In addition to the above, various preferable advantageous effects can be obtained from the first embodiment.

Subsequently to the first embodiment, second to seventh embodiments will be disclosed. In each of the embodiments, configurations similar to those of the first embodiment can be applied to the configurations not specifically described. The configurations disclosed in the respective embodiments may be combined as appropriate.

Second Embodiment

Figure 6:
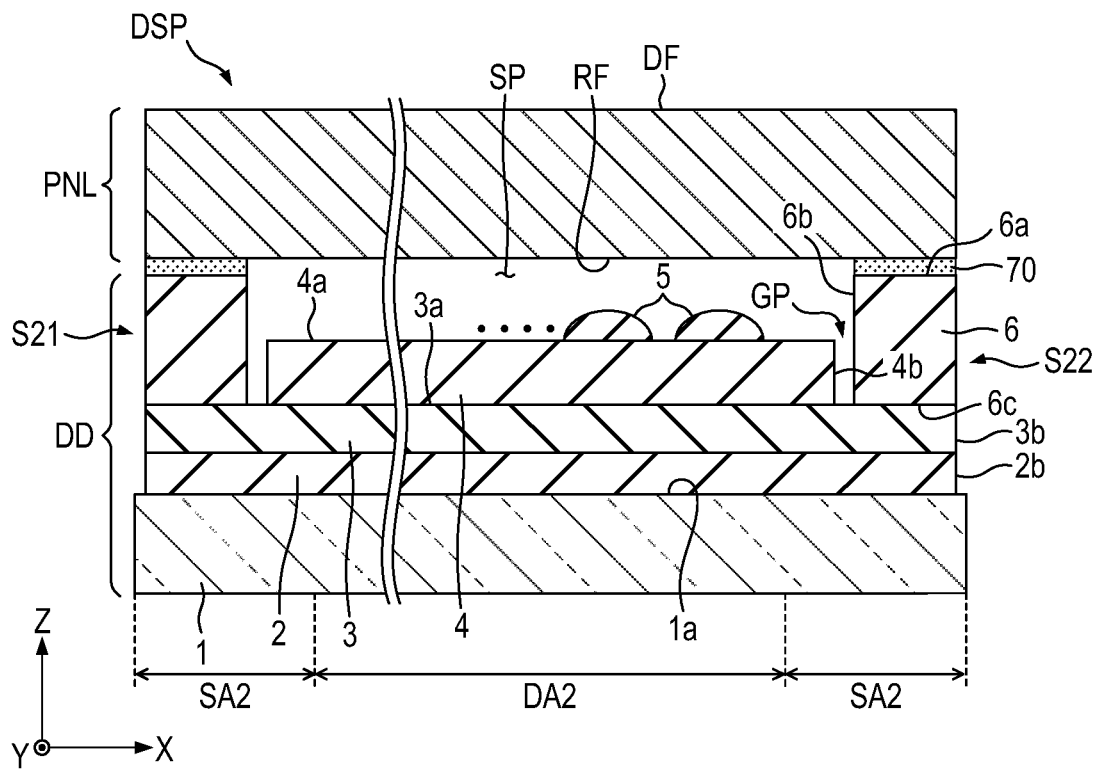
FIG. 6 is a schematic sectional view of a display device according to a second embodiment.

FIG. 6 is a schematic sectional view of a display device DSP according to a second embodiment. In the second embodiment, a circuit layer 2 and a sensor layer 3 have a size larger than that of a collimator layer 4. Thus, in a surrounding area SA2, part of the top surface 3a of the sensor layer 3 is not covered with the collimator layer 4.

The spacer 6 is placed on the top surface 3a of the sensor layer 3 in the surrounding area SA2. That is, the bottom surface 6c of the spacer 6 is in contact with the top surface 3a of the sensor layer 3. The spacer 6 protrudes in the third direction Z from lenses 5. That is, the spacer 6 has a height that is greater than the distance in the third direction Z between the apex of each of the lenses 5 and the top surface 3a of the sensor layer 3. The side surface 4b of the collimator layer 4 is opposed to the side surface 6b of the spacer 6 with a gap GP therebetween.

With the foregoing configuration, the height of the spacer 6 can be reduced more than in the example shown in FIG. 5. It is thus possible to simplify the process of forming the spacer 6.

The top surface 3a corresponds, for example, to the top surface of the insulating layer 32 shown in FIG. 2. The top surface 3a may be the top surface of the insulating layer 31 and, in this case, the insulating layer 31 is formed of an inorganic material and thus the advantage of suppressing the intrusion of moisture from the surrounding area SA2 into the detection area DA2.

Third Embodiment

Figure 7:
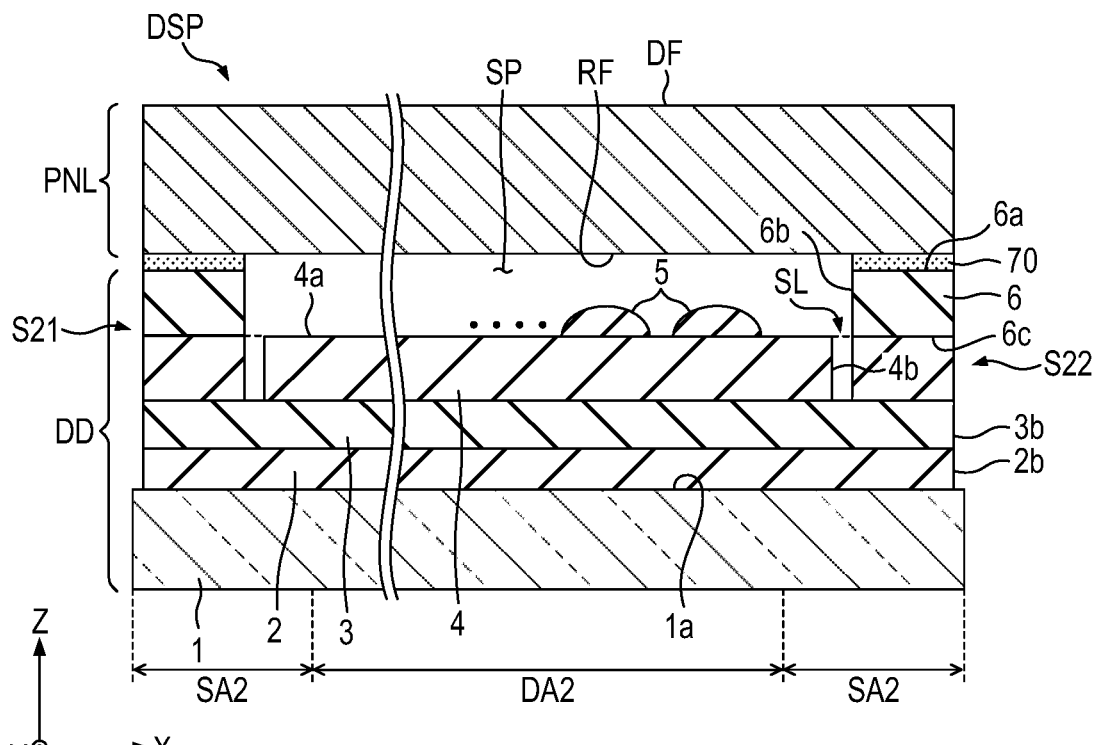
FIG. 7 is a schematic sectional view of a display device according to a third embodiment.

FIG. 7 is a schematic sectional view of the display device DSP according to a third embodiment. In the third embodiment, a circuit layer 2, a sensor layer 3 and a collimator layer 4 are also stacked in the surrounding area SA2, and a spacer 6 is placed on the top surface 4a of the collimator layer 4. That is, the bottom surface 6c of the spacer 6 is in contact with the top surface 4a. The spacer 6 protrudes in the third direction Z more than each of lenses 5. That is, the height of the spacer 6 is greater than that of each of the lenses 5.

With the configuration of the third embodiment, the height of the spacer 6 can be further reduced more than in the example shown in FIG. 6. It is thus possible to simplify the process of forming the spacer 6.

The collimator layer 4 has a slit SL in the surrounding area SA2. The slit SL penetrates each of the transparent layers 41 and 42 and cut layer 40 shown in FIG. 2, for example.

The slit SL is located inside an area surrounded by the spacer 6 in planar view. In the section of FIG. 7, the slit SL is located between the spacer 6 and the lens 5 (the lens 5 located at the end of the detection area DA2) in the first direction X. Providing the slit SL makes it possible to suppress the invasion of moisture into the detection area DA2 through the collimator layer 4.

Fourth Embodiment

Figure 8:
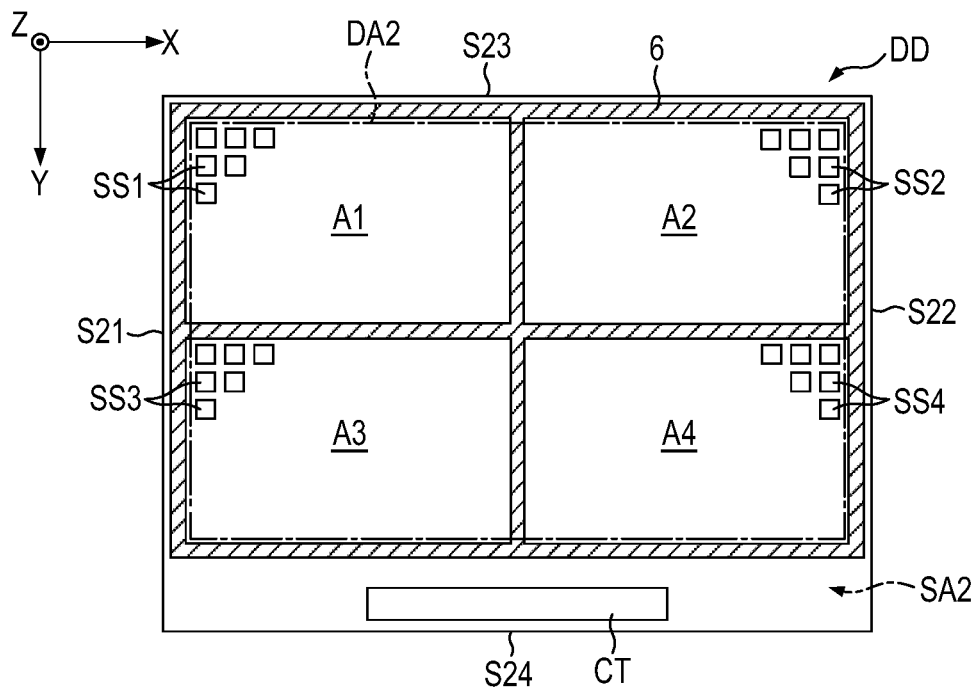
FIG. 8 is a schematic plan view of a detection device according to a fourth embodiment.

FIG. 8 is a schematic plan view of a detection device DD according to a fourth embodiment. In the fourth embodiment, the spacer 6 differs in shape from that shown in FIG. 4.

In the example of FIG. 8, the detection area DA2 includes a first area A1, a second area A2, a third area A3 and a fourth area A4. The areas A1 and A2 are arranged in the first direction X, the areas A3 and A4 are also arranged in the first direction X, the areas A1 and A3 are arranged in the second direction Y, and the areas A2 and A4 are also arranged in the second direction Y.

A plurality of first sensors SS1 are arranged in the first area A1. A plurality of second sensors SS2 are arranged in the second area A2. A plurality of third sensors SS3 are arranged in the third area A3. A plurality of fourth sensors SS4 are arranged in the fourth area A4. The configurations of the sensors SS1, SS2, SS3 and SS4 are the same as those of the sensors SS shown in FIG. 2.

The areas A1, A2, A3 and A4 are all rectangles of the same size, for example. The numbers of sensors SS1, SS2, SS3 and SS4 arranged in the areas A1, A2, A3 and A4, respectively are the same.

The spacer 6 surrounds each of the areas A1, A2, A3 and A4. That is, the spacer 6 is placed not only in the surrounding area SA2 but also in the detection area DA2 to partition the areas A1, A2, A3 and A4.

The configuration of the detection device DD according to the fourth embodiment increases the area of the top surface 6a of the spacer 6. If the entire top surface 6a and the display panel PNL are bonded by an adhesive layer 70, the detection device DD and the display panel PNL can firmly be fixed to each other. Since the spacer 6 is also placed in the detection area DA, the thickness of space SP can be uniformed further in the entire detection area DA2.

Note that the spacer 6 may partition the detection area DA into five or more areas, or two or three areas. The shapes of the areas into which the detection area DA is partitioned by the spacer 6 may be different from each other. The sensors SS arranged in the areas may be different in number from each other.

Fifth Embodiment

Figure 9:
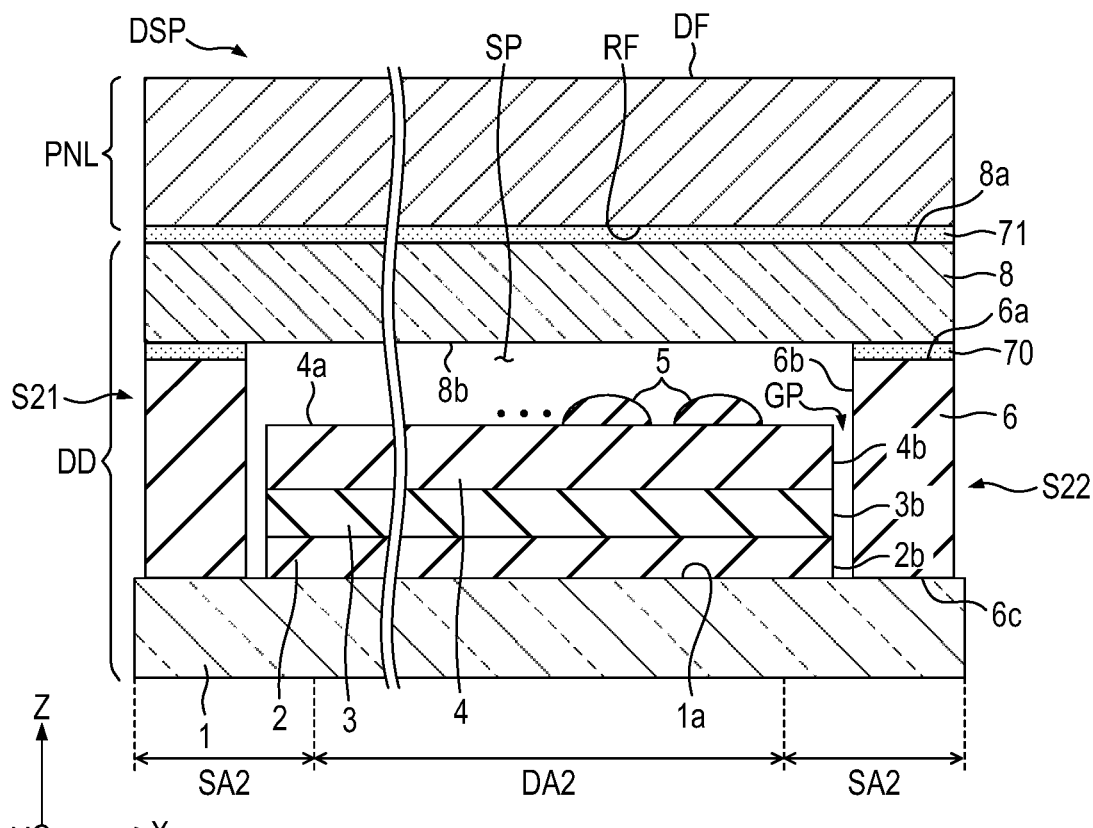
FIG. 9 is a schematic sectional view of a display device according to a fifth embodiment.

FIG. 9 is a schematic sectional view of a display device DSP according to a fifth embodiment. In the fifth embodiment, the detection device DD further includes a cover member 8. As the cover member 8, for example, a glass substrate and a resin substrate can be used. The cover member 8 overlaps a detection area DA2 and a surrounding area SA2. That is, the cover member 8 is opposed to lenses 5 and the top surface 6a of a spacer 6.

The cover member 8 has a top surface 8a and a bottom surface 8b. The bottom surface 8b is bonded to the top surface 6a of the spacer 6 by an adhesive layer (first adhesive layer) 70. In the fifth embodiment, a space SP is formed between a collimator layer 4 and the cover member 8, and the lenses 5 are arranged in the space SP.

In the example of FIG. 9, the spacer 6 is placed on the top surface 1a of a base 1. The spacer 6 may be placed on a sensor layer 3 as in the example of FIG. 6, or may be placed on the collimator layer 4 as in the example of FIG. V.

The top surface 8a of the cover member 8 is bonded to the rear surface RF of a display panel PNL by an adhesive layer (second adhesive layer) 71. The adhesive layer 71 is formed, for example, entirely between the top surface 8a and the rear surface RF, and overlaps the detection area DA2. This configuration increases the area of bonding between the detection device DD and the display panel PNL, with the result that the detection device DD and the display panel PNL can firmly be fixed to each other.

When the base 1 and the cover member 8 are formed of glass, for example, they can be thinned by etching both the top and bottom surfaces of the detection device DD. As a result, the detection device DD and the display device DSP can be thinned.

Sixth Embodiment

Figure 10:
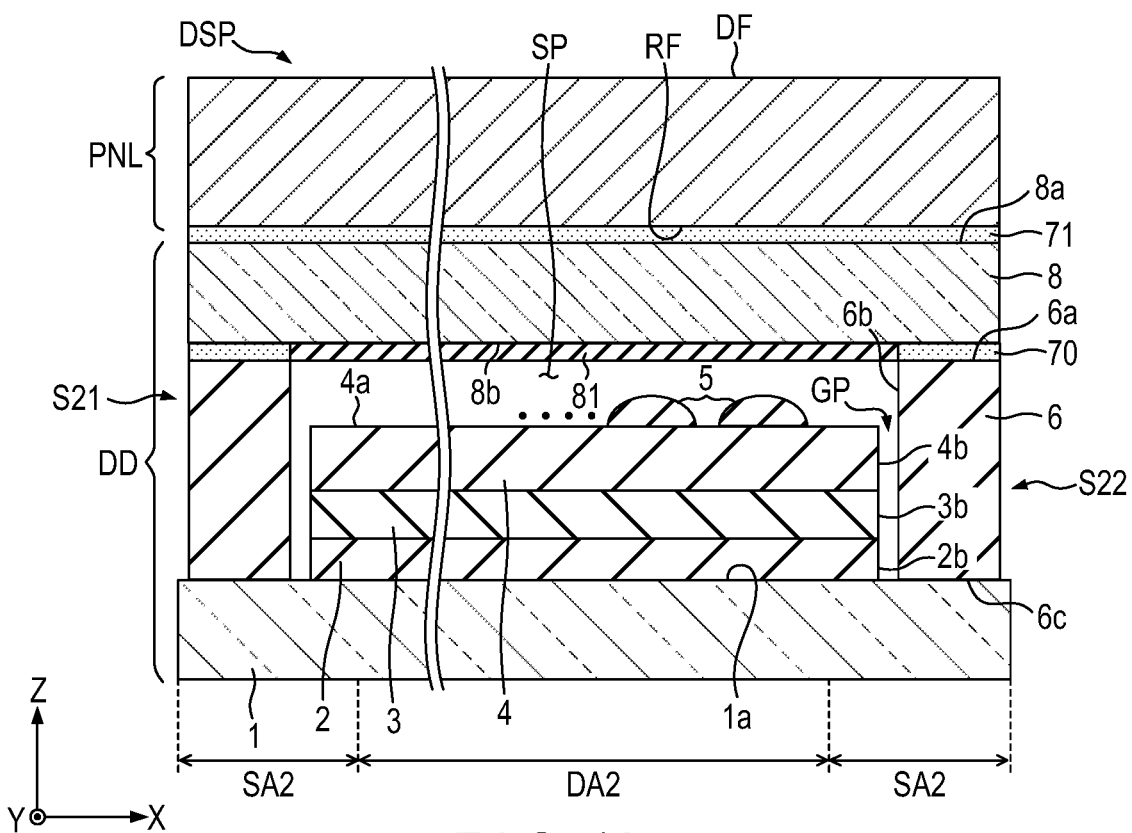
FIG. 10 is a schematic sectional view of a display device according to a sixth embodiment.

FIG. 10 is a schematic sectional view of a display device DSP according to a sixth embodiment. The detection device DD includes a cover member 8 as in the example of FIG. 9. In the sixth embodiment, a cut layer 81 is formed on the bottom surface 8b of the cover member 8.

Like the cut layer 40 shown in FIG. 2, the cut layer 81 is formed of a material having a lower transmittance of light in a specific wavelength region than transparent layers 41 and 42 and lenses 5 (a material having a higher absorbance or reflectance of light in a specific wavelength region). As in the case of the cut layer 40, the specific wavelength region is, for example, 650 nm or more and 800 nm or less, and may further include a band of 800 nm or more. When the cut layer 81 is provided, the collimator layer 4 may not include any equivalent for the cut layer 40.

The cut layer 81 is sized to overlap the entire detection area DA2. That is, each of the lenses 5 is opposed to the cut layer 81. In the example of FIG. 10, the cut layer 81 is not formed between an adhesive layer 70 and the bottom surface 8b. However, as another example, the cut layer 81 may be formed between the adhesive layer 70 and the lower surface 8b.

From the viewpoint of transmittance, the cut layer 81 is preferably a dielectric multilayer film. The cut layer 81 provided in the cover member 8 is more easily formed of a dielectric multilayer film than the cut layer 40 included in the collimator layer 4.

Seventh Embodiment

Figure 11:
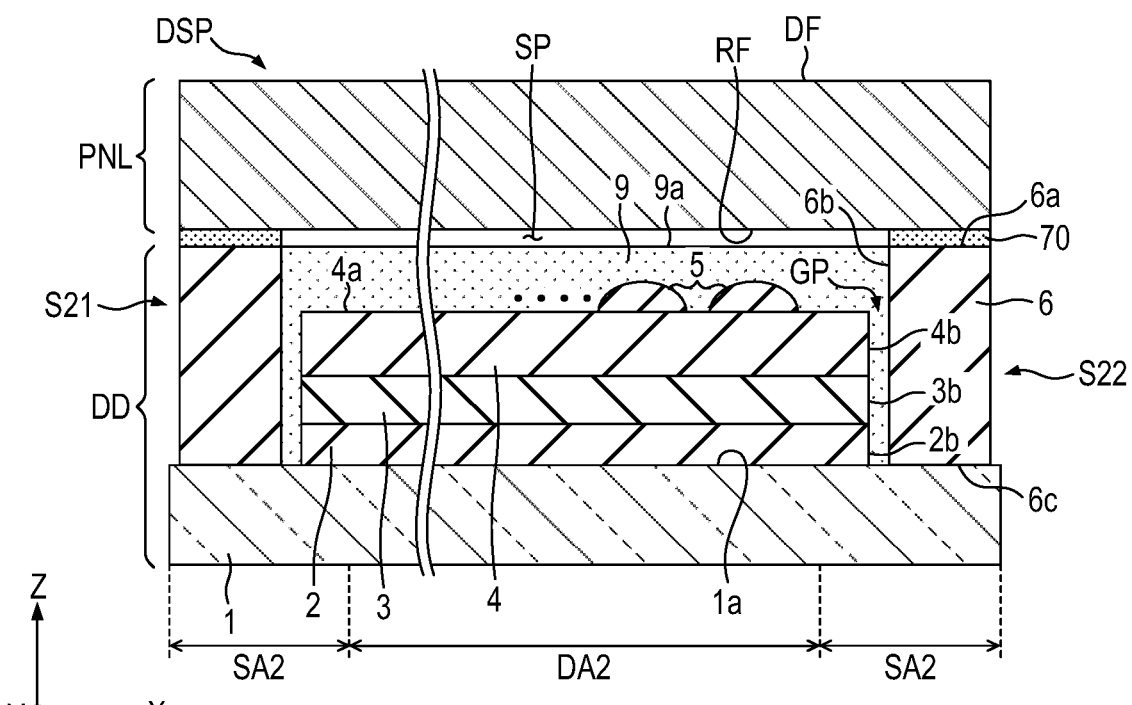
FIG. 11 is a schematic sectional view of a display device according to a seventh embodiment.

FIG. 11 is a schematic sectional view of a display device DSP according to a seventh embodiment. In the seventh embodiment, the detection device DD further includes a transparent protective layer 9 surrounded by a spacer 6. The protective layer 9 has a refractive index that is lower than that of lenses 5.

The protective layer 9 covers the lenses 5 and the top surface 4a of a collimator layer 4. The protective layer 9 also fills a gap GP. That is, the protective layer 9 covers the side surface 2b of a circuit layer 2, the side surface 3b of a sensor layer 3, the side surface 4b of the collimator layer 4, and the side surface 6b of the spacer 6.

In the example of FIG. 11, the position of the top surface 9a of the protective layer 9 coincides with the position of the top surface 6a of the spacer 6 in the third direction Z. The top surface 9a may be located below the top surface 6a. A space SP is formed between the top surface 9a and the rear surface RF of the display panel PNL.

If the protective layer 9 is provided as in the seventh embodiment, the lenses 5 can be protected. As a result, the yield of the detection device DD and the display device DSP can be improved.

The protective layer 9 can be formed by, for example, an ink jet method. In this case, the spacer 6 also functions as a bank for damming the protective layer 9.

The protective layer 9 may be formed of a material having a low transmittance of light in a specific wavelength region, and the protective layer 9 may serve as a cut layer. As in the case of the cut layer 40, the specific wavelength region is, for example, 650 nm or more and 800 nm or less, and may further include a band of 800 nm or more. In this case, the collimator layer 4 may not include any equivalent for the cut layer 40.

Several modifications to the display device DSP and the detection device DD with the protective layer 9 will be described below.

FIG. 12 is a schematic sectional view of a display device DSP according to a first modification. In this modification, an adhesive layer 70 is also disposed between the top surface 9a of a protective layer 9 and the rear surface RF of a display panel PNL. That is, the adhesive layer 70 is opposed to each of lenses 5 via the protective layer 9. This configuration increases the area of bonding between the detection device DD and the display panel PNL, with the result that the detection device DD and the display panel PNL can firmly be fixed to each other.

FIG. 13 is a schematic sectional view of a display device DSP according to a second modification. A spacer 6 is placed on the top surface 3a of a sensor layer 3 as in the example of FIG. 6. The protective layer 9 covers lenses 5 and fills a gap GP. An adhesive layer 70 is formed between the top surface 6a of the spacer 6 and the rear surface RF of the display panel PNL. As in the example of FIG. 12, the adhesive layer 70 may be further formed between the top surface 9a of the protective layer 9 and the rear surface RF.

Figure 14:
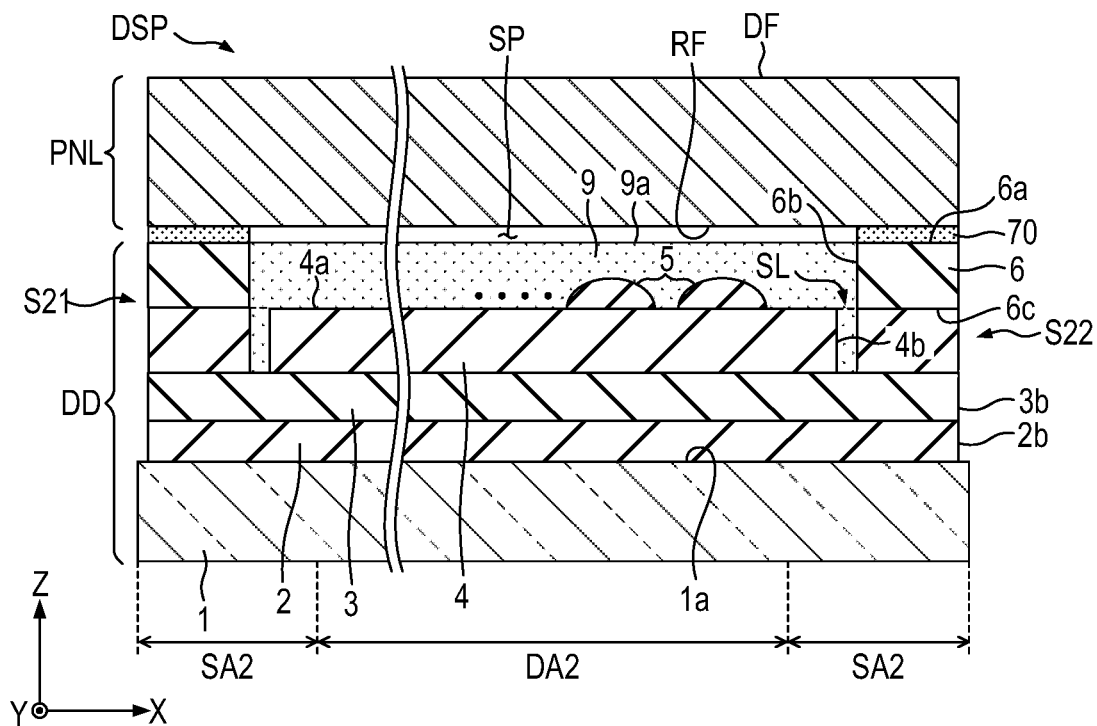
FIG. 14 is a schematic sectional view of a display device according to a third modification.

FIG. 14 is a schematic sectional view of a display device DSP according to a third modification. A spacer 6 is placed on the top surface 4a of a collimator layer 4 as in the example of FIG. 7. A protective layer 9 fills a slit SL of the collimator layer 4. An adhesive layer 70 is formed between the top surface 6a of the spacer 6 and the rear surface RF of the display panel PNL. As in the example of FIG. 12, an adhesive layer 70 may be further formed between the top surface 9a and the rear surface RF of the protective layer 9.

Figure 15:
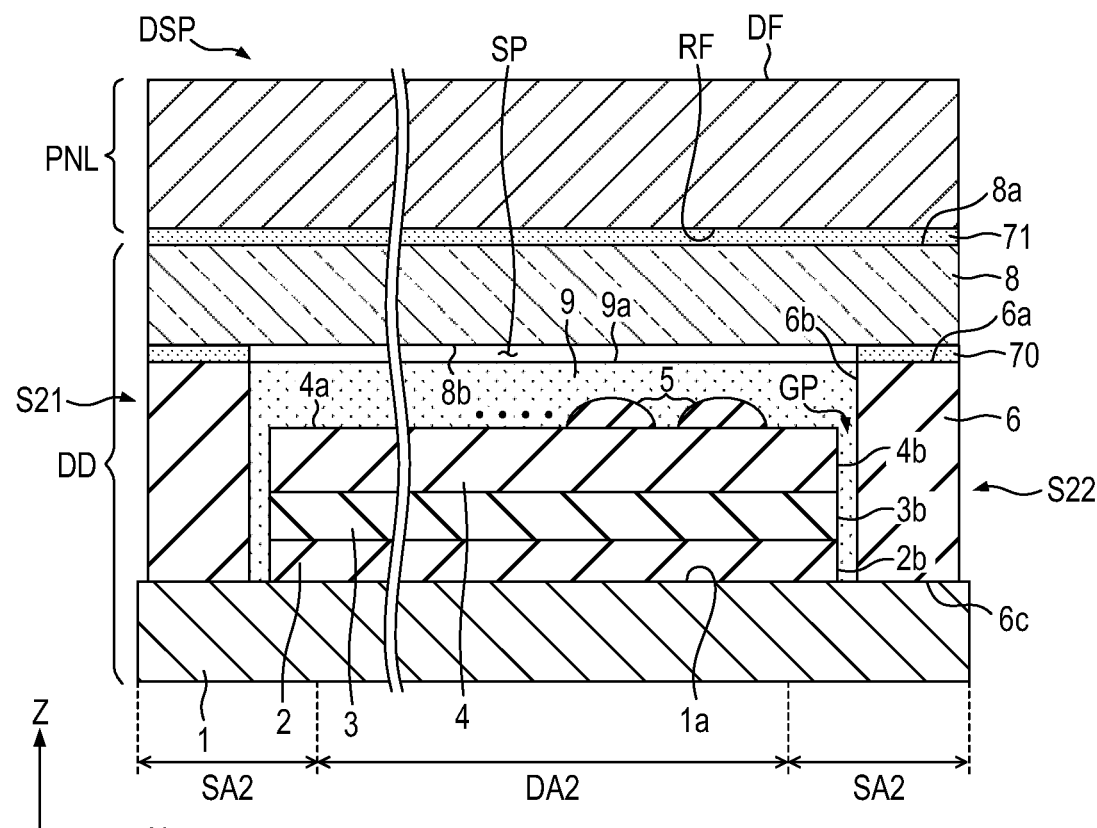
FIG. 15 is a schematic sectional view of a display device according to a fourth modification.

FIG. 15 is a schematic sectional view of a display device DSP according to a fourth modification. As in the example of FIG. 9, the detection device DD includes a cover member 8. The top surface 8a of the cover member 8 is boned to the rear surface RF of a display panel PNL by an adhesive layer 71. An adhesive layer 70 is formed between the top surface 6a of a spacer 6 and the rear surface RF of the display panel PNL. As in the example of FIG. 12, the adhesive layer 70 may be further formed between the top surface 9a of the protective layer 9 and the rear surface RF.

Based on the detection devices and display devices which have been described in the above-described embodiments, a person having ordinary skill in the art may achieve a display device with an arbitral design change; however, as long as they fall within the scope and spirit of the present invention, such a detection device or a display device is encompassed by the scope of the present invention.

A skilled person would conceive various changes and modifications of the present invention within the scope of the technical concept of the invention, and naturally, such changes and modifications are encompassed by the scope of the present invention. For example, if a skilled person adds/deletes/alters a structural element or design to/from/in the above-described embodiments, or adds/deletes/alters a step or a condition to/from/in the above-described embodiment, as long as they fall within the scope and spirit of the present invention, such addition, deletion, and altercation are encompassed by the scope of the present invention.

Furthermore, regarding the present embodiments, any advantage and effect those will be obvious from the description of the specification or arbitrarily conceived by a skilled person are naturally considered achievable by the present invention.

What is claimed is:

1. A detection device comprising:
    a base;
    a circuit layer placed on the base and including transistors;
    a sensor layer placed on the circuit layer and including a plurality of sensors which output detection signals corresponding to incident light;
    a collimator layer placed on the sensor layer and including a collimator including a plurality of openings which overlap the sensors, respectively;
    a plurality of lenses placed on the collimator layer and overlapping the openings, respectively;
    a spacer protruding more than the lenses in a stacking direction of the base, the sensor layer and the collimator layer; and
    a protective layer having a refractive index that is lower than that of each of the lenses and covering the lenses, wherein
    the spacer has a frame shape surrounding the lenses,
    the sensors include a first sensor disposed in a first area and a second sensor disposed in a second area;
    the spacer surrounds each of the first area and the second area,
    the spacer includes a bottom surface that is in contact with a top surface of the base,
    a side surface of the sensor layer and a side surface of the collimator layer are opposed to the spacer with a gap therebetween, the spacer surrounds the protective layer, the protective layer fills the gap, a part of the protective layer filling the gap is interposed between the side surface of the sensor layer and the spacer, and a thickness of the protective layer is larger than a total thickness of the circuit layer, the sensor layer, the collimator layer, and the lenses.

2. The detection device of claim 1, wherein the collimator layer includes a cut layer which overlaps the openings and blocks at least part of light in a wavelength region of 650 nm or more.

3. The detection device of claim 1, further comprising:

a cover member which is opposed to the lenses; and a first adhesive layer by which the spacer and the cover member are bonded to each other.

4. The detection device of claim 3, further comprising a cut layer provided on the cover member and opposed to the lenses to block at least part of light in a wavelength region of 650 nm or more.

5. A display device comprising:

the detection device of claim 3;

a display panel overlapping the detection device; and a second adhesive layer by which the cover member is bonded to the display panel.

6. The display device of claim 5, further comprising a cut layer provided on the cover member and opposed to the lenses to block at least part of light in a wavelength region of 650 nm or more.

7. A display device comprising:

the detection device of claim 1;

a display panel overlapping the detection device; and an adhesive layer by which the display panel is boned to a spacer.

8. The display device of claim 7, wherein the collimator layer includes a cut layer which overlaps the openings and blocks at least part of light in a wavelength region of 650 nm or more.

\* \* \* \* \*